United States Patent [19]
McIntyre

[11] Patent Number: 5,932,925
[45] Date of Patent: Aug. 3, 1999

[54] ADJUSTABLE-PRESSURE MOUNT HEATSINK SYSTEM

[75] Inventor: Gerald L. McIntyre, Cupertino, Calif.

[73] Assignee: Intricast, Inc., Santa Clara, Calif.

[21] Appl. No.: 08/914,913

[22] Filed: Aug. 18, 1997

Related U.S. Application Data

[60] Provisional application No. 60/025,680, Sep. 9, 1996.

[51] Int. Cl.$^6$ ........................................................ H05K 7/20
[52] U.S. Cl. ........................... 257/719; 257/726; 257/727; 257/718; 361/704; 165/185; 165/80.2; 174/16.3
[58] Field of Search ..................................... 257/712, 713, 257/718, 675, 706, 720, 727, 704, 710, 726, 717, 722, 719; 361/818, 704, 719, 714, 720, 388, 386, 16.3; 165/80.2, 185

[56] References Cited

U.S. PATENT DOCUMENTS

| | | |
|---|---|---|
| 4,103,737 | 8/1978 | Perkins . |
| 4,620,216 | 10/1986 | Horvath . |
| 4,884,631 | 12/1989 | Rippel . |
| 5,003,429 | 3/1991 | Baker et al. . |
| 5,031,072 | 7/1991 | Malhi et al. . |
| 5,133,403 | 7/1992 | Yokono et al. . |
| 5,166,775 | 11/1992 | Bartilson . |
| 5,280,409 | 1/1994 | Selna et al. ............................. 257/720 |
| 5,304,846 | 4/1994 | Azar et al. . |
| 5,345,107 | 9/1994 | Daikoka et al. ......................... 257/717 |
| 5,357,404 | 10/1994 | Bright et al. ............................ 257/718 |
| 5,521,439 | 5/1996 | Casati et al. ............................ 257/718 |
| 5,561,325 | 10/1996 | Ueno et al. ............................. 257/718 |
| 5,662,163 | 9/1997 | Mira ......................................... 257/718 |
| 5,784,257 | 7/1998 | Tata .......................................... 257/719 |

*Primary Examiner*—Alexander Oscar Williams
*Attorney, Agent, or Firm*—Michael J. Hughes; Larry B. Guernsey

[57] ABSTRACT

An adjustable pressure mount heatsink subassembly (10) is provided for use with an electronic chip component (16). The system (10) includes a heatsink portion (12) having a block (28) which has a formed thereon to extend the lateral dimension of the circuit board portion (20) of the chip component (16). A mounting subassembly (14) is, in the preferred embodiment, disposed substantially within the transverse channel (34) and includes a spring clip (40) having a threaded aperture (44) centrally located in a pretensioned arc portion (46) and a pair of opposed end portions (48) for engaging the circuit board portion board edges (26). The pressure of attachment is adjusted by a threaded screw (42) which extends through the threaded aperture (44) and engages the channel floor (36) of the heatsink block (28). An optional nonconductive coating (52) is provided on the clip ends (48) in order to prevent unintended electrical conductance. Alternative embodiments (410) and (510) include, respectively, an overlarge contact surface (430) with clip apertures (456) to facilitate board engagement, and a a receiving recess (560) for mating with a glob portion (19) surrounding the heat producing chip (17) on the electronic component (16). The system (10) is especially adapted for use with surface mounted components such as ball grid arrays where a narrow inter-board gap (23) is typical.

16 Claims, 5 Drawing Sheets

ADJUSTABLE-PRESSURE MOUNT HEATSINK SYSTEM

This application claims the benefit of U.S. Provisional Application No. 60/025,680, filed Sep. 9, 1996, and claims the priority of its filing date.

TECHNICAL FIELD

The present invention relates generally to thermal distribution structures, and more particularly to heatsink structures utilized with semiconductor components, especially surface mount components.

BACKGROUND ART

Dissipation of excess heat is frequently a major concern of designers of equipment. Electronic components, in particular, need to have methods of carrying away excess thermal energy or suffer unacceptable failure rates. As micro-miniaturization continues to compress more and more effective components into smaller and smaller volumes, the problems caused by retained heat become severe. Accordingly, finding ways to keep the components cool enough to maintain optimal operating conditions has become an area of significant inventive efforts.

One of the most popular methods utilized to dissipate heat is convection dissipation, especially via cooling fans in the vicinity of the components. In this method, the moving air carries thermal energy from the heated component and dissipates it to the ambient atmosphere. While this is sufficient for many purposes, it has been found that fan cooling, standing alone, is not enough provide the needed cooling for many circumstances.

Another commonly utilized method of heat dissipation utilizes a combination of conduction and radiation. Devices, known as "heatsinks" are adapted to mount in direct contact with the components such that the thermal energy may be conducted, in accordance with equilibrium principles, from the component to the heatsink device. Most heatsinks are then provided with substantial surface area not in contact with the component such that the conducted thermal energy can dissipate into the air. Many heatsink devices include dissipation fins of various configurations, while others rely principally on substantial mass to absorb the heat, especially transient heat.

One of the most effective approaches, especially in situations where components continually generate a relatively large amount heat which must be dissipated, is to combine heatsinks and fans. For this reason, some heatsinks are provided with attachment structures to allow fan mechanisms to be directly attached.

Among the prior art methods and devices which have been the subject of U.S. Pat. Nos. 4,620,216, issued to Horvath; 5,003,429, issued to Baker, et al.; 5,031,072, issued to Malhi et al.; 5,166,775, issued to Bartilson; 5,133,403, issued to Yokono, et al.; and 5,304,846, issued to Azar, et al. Each of these examples uses a variety of configurations of heat dissipation geometries to optimize the dissipation of heat absorbed by a contact portion of the device from the associated component(s).

Among those prior patents which utilize some form of moving air and convection to dissipate the heat are U.S. Pat. No. 4,103,737, issued to Perkins, and U.S. Pat. No. 4,884,631, issued to Rippel.

As certain types of components have become more popular, the types of heatsink devices have become almost of secondary importance as to the manner in which the heat is dissipated. Instead, the nature of the contact with the component has become critical. Good thermal contact surfaces to facilitate conductive transfer are more and more important. Further, maintaining the contact without potential damage to the component and attaching the heatsink in smaller geometric volumes have become significant factors.

Accordingly, in addition to improved heat dissipation characteristics from the heatsink devices themselves, there remains a great deal of room for improvements in the fields of attachment of the heatsink device to the component.

SUMMARY OF THE INVENTION

Accordingly, it is an object of the present invention to provide a heatsink device which may be mounted on semiconductor devices in a manner which achieves the optimal pressure for thermal transfer and dissipation while avoiding damage to the components.

It is another object of the invention to provide a mounting structure in which torque on the adjustment means is directly analogous to pressure on the component, permitting automated tightening to an optimal pressure range.

It is yet another object of the invention to provide a pressure adjustment system which facilitates holding the heatsink in place on the component sufficiently firmly to avoid dislodging in shake tests, without undue fear of stressing the component to the breaking point.

It is a further object of the present invention to provide a low profile attachment structure, such that the attachment does not interfere with the electrical contact between the surface-mount component and associated carriers, backbones/backplanes and the like, particularly with minimal protrusion components such as ball-grid array electronic components.

Still another object of the present invention is to provide good thermal conductance contact with epoxy "globs" while avoiding excess gaps and minimizing the overall height of the heatsink structure with respect to the PCB backplane.

It is yet another object of the invention to provide a heatsink system which firmly attaches to the component for good thermal dissipation, while avoiding undue warping force on the circuit board, thus minimizing contact loss and breakage.

Briefly, a preferred embodiment of the present invention is a heatsink system including a heatsink device with an integral attachment structure which is adapted to attach the heatsink to a relatively flat, relatively rigid semiconductor component, particularly of the surface mount type, in a manner in which adjustable pressure can be set and maintained. The system incorporates an otherwise conventional heatsink element having a transverse trench extending across the middle of the block portion to receive a spring clip connector therein. The end portions of the spring connectors protrude beyond the block and depend below the contact surface to engage opposing edges of the circuit board portion of the component. Each end portion includes a restraining lip, which may have a nonconductive coating, which secures the spring clip to the board portion. Within the transverse trench, the spring clip is in the form of a pretensioned arc which engages an adjustment screw in a manner such that rotation of the screw adjusts the binding force delivered to the board portion from the restraining lips. In this manner, pressure between the contact surface of the heatsink block and the thermal transfer surface of the chip portion may be set and maintained at a level which provides good thermal conductivity while avoiding excessive warping forces on the circuit board. Once empirical parameters have been determined for a particular design of component and batch of spring clip members, the process can be made repeatable by utilizing a torque driver to turn the adjustment screw to the desired pressure setting.

A (first) alternative embodiment of the invention is utilized for situations where an oversized heatsink is desired. In this embodiment, the heatsink block extends beyond the lateral borders of the component and is provided with clip apertures situated to be aligned with the board edges of the component. The spring clip then depends through the clip apertures to engage the circuit board in the same manner as in the preferred embodiment. Additional fin segments are provided on the heatsink block exterior to the clip apertures in this embodiment.

Another (second) alternate embodiment is substantially similar to either of the above described embodiments and further includes a receiving recess on the contact surface for receiving the protruding epoxy "glob" portion of the chip in order to facilitate mounting and thermal contact and to inhibit lateral slippage.

An advantage of the present invention is that it may be utilized in an automated fashion, for example by a preset torque wrench/driver to rapidly and repeatably achieve optimally secure attaching to and heat transfer from a component without damaging the component or carrier.

Another advantage of the present invention is that it is simple in structure and easily manufactured.

A further advantage of the present invention is that the heatsink and connector are easily detached and reused.

Yet another advantage of the present invention is that, for similar lateral dimensions, identical hardware may be utilized with a variety of components.

Still another advantage is that the connection hardware does not significantly protrude below the component carrier, thus facilitating use with ball-grid array and similar low-profile surface-mounted components.

A still further advantage of the invention is that it eliminates the necessity for adhesives to hold the assembly in place, thus avoiding any attendant decease in thermal conductivity.

These and other objects and advantages of the present invention will become clear to those skilled in the art in view of the description of the best presently known modes of carrying out the invention and the industrial applicability of the preferred and alternate embodiments as described herein and as illustrated in the several figures of the drawings.

BEST MODE FOR CARRYING OUT THE INVENTION

Figure 1:
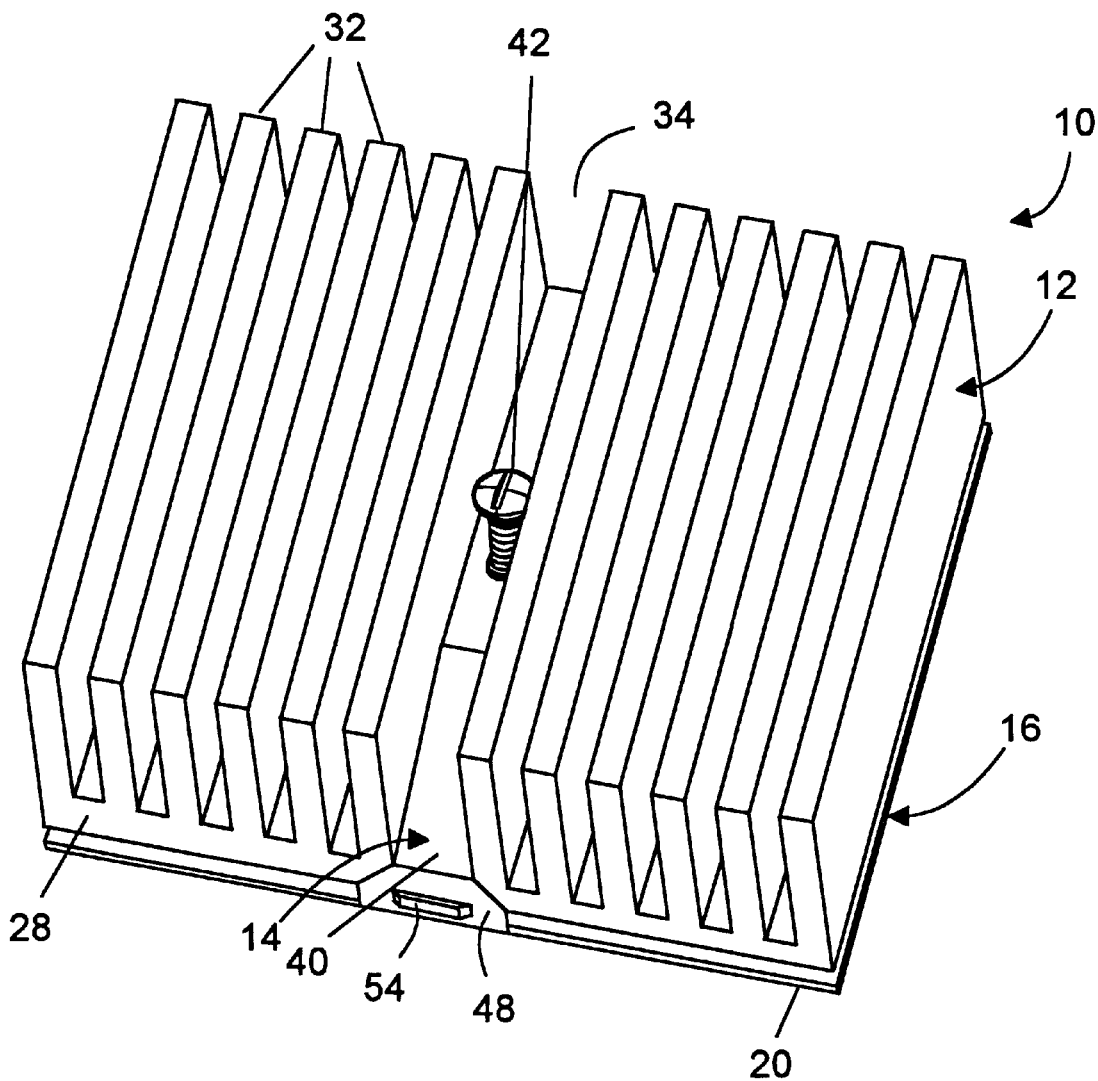
FIG. 1 is a perspective view of an adjustable-pressure mount heat sink system, according to the present invention, shown mounted on a surface-mounted type of electronic component.
Figure 2:
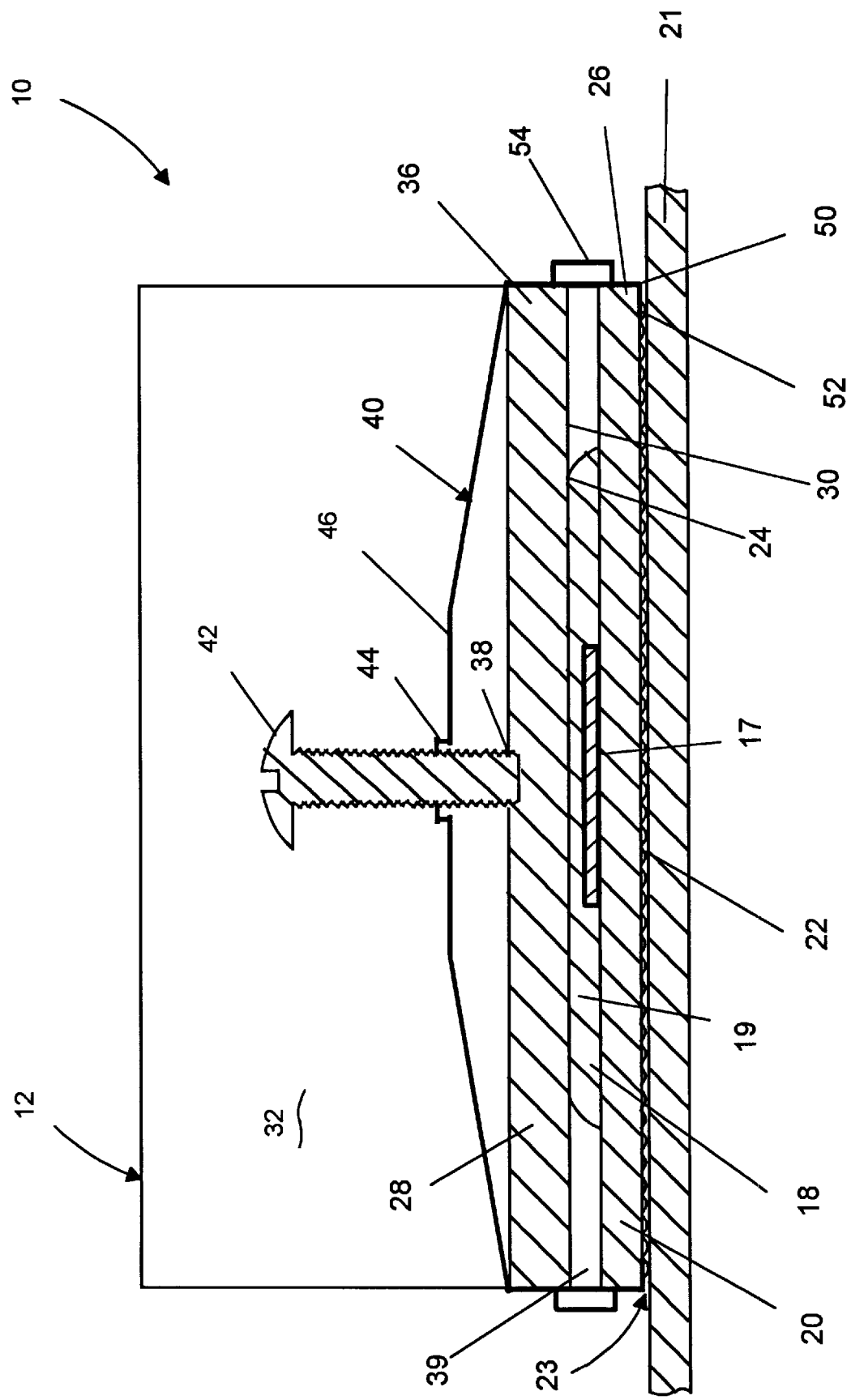
FIG. 2 is a cross-sectional view, taken along line 2—2 of FIG. 1.
Figure 3:
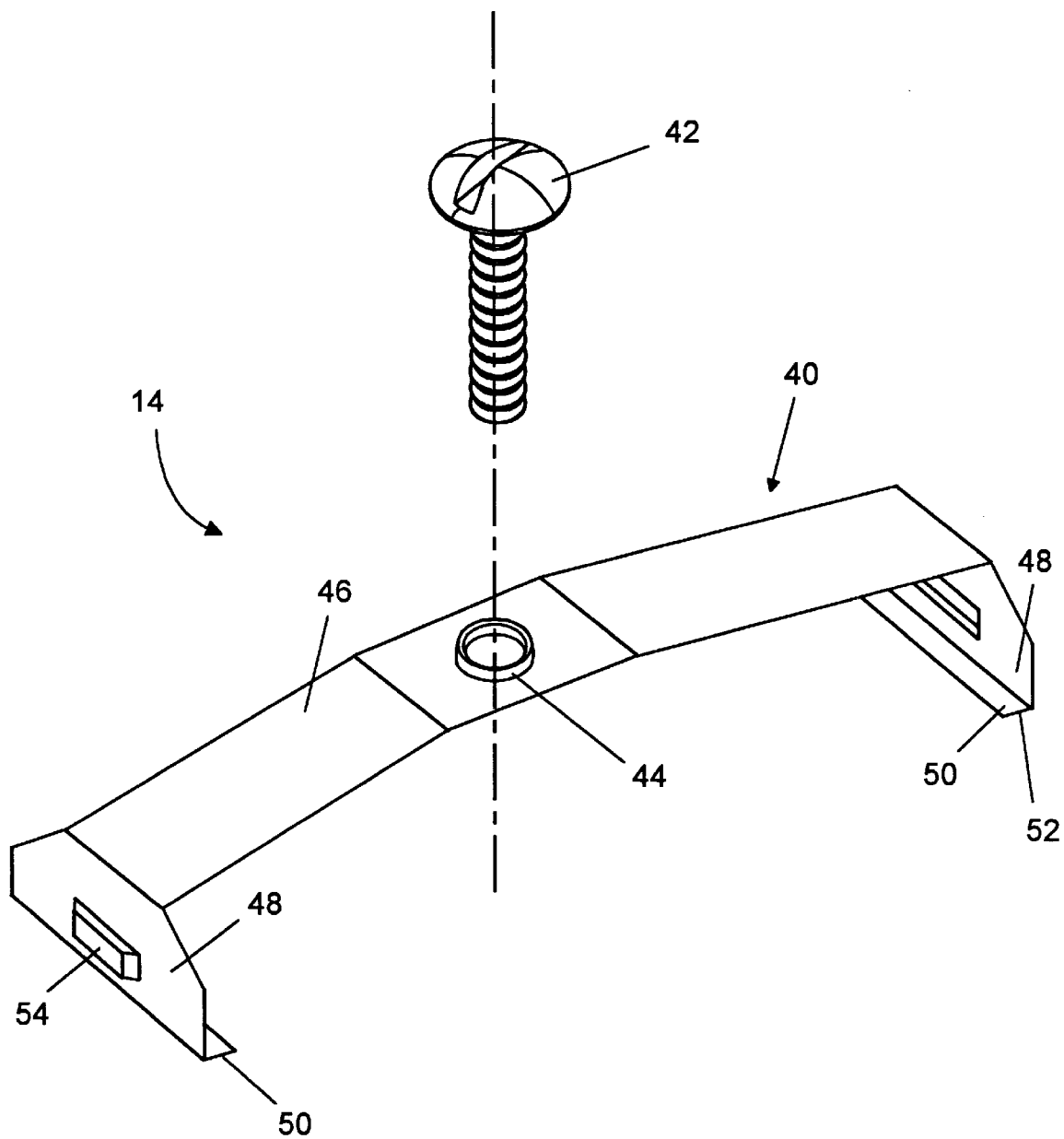
FIG. 3 is an exploded perspective view of an adjustable-pressure mounting connector of the present invention.

The present invention is an adjustable-pressure mount heatsink system specifically adapted for mounting upon electronic components such as semiconductor chips attached to generally planar carriers. A preferred embodiment of the invention is illustrated in FIGS. 1–3 of the drawings and is designated therein by the general reference character 10. The system may be thought of as including a heatsink subassembly 12 and a mounting subassembly 14. A generic electronic component upon which the system is to be mounted is illustrated in FIGS. 1 and 2 as a component subassembly 16, in this case being a surface-mounted type, in the form of a conventional ball-grid array component.

Referring now especially to FIG. 2, it may be seen that the component subassembly 16 includes an actual chip 17 situated in a chip portion 18, which is ordinarily mounted on (or incorporated in) a circuit board portion 20. The "chip" 17 is only the actual silicon, while the term "chip portion 18", as used herein, includes the entire physical structure. Typically this will include an encasing volume formed of plastic/epoxy/resin/ceramic/etc. which is typically referred to as a glob 19. The chip 17 can be any of a wide variety of types of electronic components, such as a custom processor, video processor or the like. The component subassembly 16 for which the present system 10 is particularly adapted is the surface-mount configuration in which the circuit board 20 extends beyond the chip portion 18 and provides the interface with a PCB (printed circuit board) 21 (see FIG. 2), in the form of a motherboard, backbone or other structure with which the component subassembly 16 is to be utilized. The PCB 21 is not a part of the invention, but is illustrated in a conventional fashion herein for ease of understanding of the performance aspects. In this type of structure, the electrical connection with the PCB, etc. is provided by electrical contacts 22 on the board 20. The thickness of the electrical contacts 22 causes an inter-board gap 23 to be maintained between the circuit board 20 and the PCB 21. This inter-board gap 23 prevents unwanted electrical, thermal and physical contact. A thermal contact surface 24 exists on the chip portion 18, opposite the board 20, and provides the thermal conducting surface to interface with the heatsink subassembly 12.

The lateral perimeter of the component subassembly 16 defines a board edge 26. In most applications, the component subassembly 16 will be square in shape and generally planar, with the board 20 having a shallow thickness and the chip portion 18 extending above the board 20 for an extent. Other lateral shapes may be utilized for particular applications but, for the purposes of description, the square arrangement is assumed. Relatively standard dimensions are utilized for a given class of components and for a given specific component, substantial uniformity of shape and size is expected in the industry. Thus, the heatsink subassemblies 12 designed for use with the particular components can be of known dimensions and configurations for performance, and need not be custom manufactured for each individual component assembly 16.

Referring now to the heatsink subassembly 12 (illustrated in FIGS. 1 and 2), it may be seen that this is a unitary structure which is extruded, cast, forged, milled and/or otherwise manipulated to its final configuration. In most aspects, the heatsink subassembly 12 of the present invention is conventional in structure, in that it includes a sink block portion 28 which has a flat contact surface 30 on its "bottom" and a plurality of dissipation fins 32 extending upward. This is in accordance with standard practice, with the contact surface 30 being adapted to provide good wide-area contact with the thermal contact surface 24 of the chip portion 18 for thermal conductance, and the dissipation fins 32 being configured in such a way to efficiently transfer the heat to the ambient atmosphere in order to provide thermal equilibrium at a temperature which is non-detrimental to the function or life of the chip portion 18. For most purposes, the particular form of the heatsink subassembly 12 is not critical to the invention and the particular structure illustrated is selected for ease of description only.

The heatsink subassembly 12 of the present invention differs from those of conventional types in that it is provided with a transverse channel 34 (see FIG. 1) which extends completely across the block 10, and defines a channel floor portion 36. The transverse channel is open to the "top" and has no dissipation fins 32 extending therein. The channel floor 36 is generally flat on both upper and lower surfaces and, in the preferred embodiment, is provided with a centering detent 38 to interface with the mounting subassembly 14. The thickness of the channel floor 36 may or may not be the same as the thickness of the block portion 28 situated underneath the dissipation fins 32, depending on the particular purpose of the system 10.

As is particularly illustrated in FIG. 2, the sink block 28 of the preferred embodiment 10 is of shape and size to extend laterally to the same extent as the circuit board 20, although congruence is actually required only in the dimension corresponding to the transverse channel 34. This means that the opposing ends of the transverse channel 34 are disposed above corresponding portions of the board edge 26. The planar nature of the contact surface 30 of the heatsink subassembly 12 and the circuit board 20, combined with the thickness of the chip portion 18 provides that a peripheral gap 39 is formed between the heatsink subassembly 12 and the component subassembly 16, except at the chip portion 18. This peripheral gap 39 results in a potential for bending/breaking the circuit board 20 if too much upward pressure is applied to the board edges 26, necessitating careful control of such forces.

The structure of the mounting subassembly 14 is best illustrated in FIGS. 2 and 3, where it may be seen to include a spring clip 40 and an adjusting screw 42. The threaded adjusting screw 42 mates with a complimentarily threaded aperture 44 extending through a pretensioned arc portion 46 of the spring clip 40. A pair of end portions 48 depend "downward" from the opposing ends of the pretensioned arc potion 46, each end portion 48 terminating in a lip 50. In the preferred embodiment 10, the lips 50 are provided with an optional nonconductive coating 52 which prevents electrical shorts or sparks from the circuit board 20 and/or the PCB 21 to the spring clip 40. Also in the preferred embodiment 10, the end portions are provided with protruding pry handles 54 which provide a purchase for applying lateral outward force on the associated lip 50, thus facilitating removal of the mounting subassembly 14 from the component subassembly 16.

Figure 4:
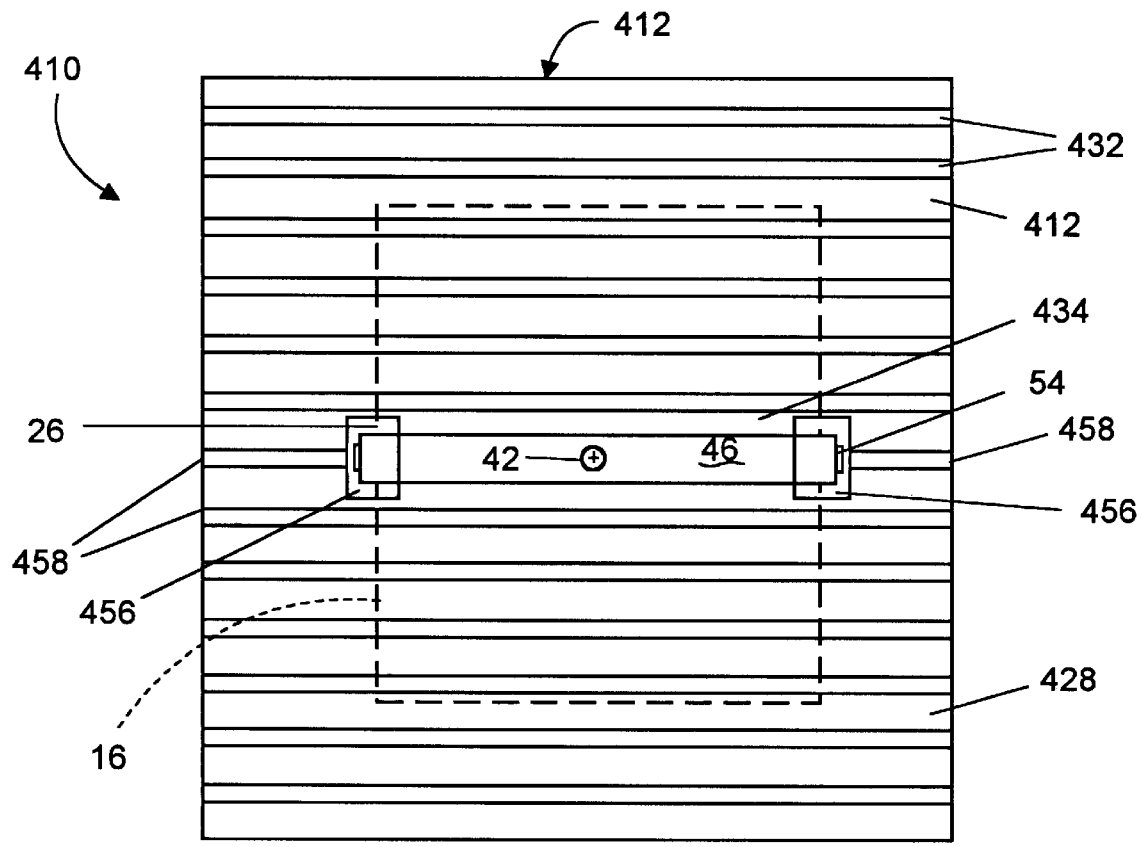
FIG. 4 is a top plan view of a first alternative embodiment of the invention.

A first alternate embodiment of the inventive system is illustrated in FIG. 4, in a top plan view, and designated by the reference character 410. This alternate embodiment 410 is adapted for situations where the heatsink portion of the structure is desired to be a larger lateral size than the component to which it is to be attached. This type of use is valuable in the case of particularly "hot" chips where a larger dissipation surface area is required in order to maintain good temperature control.

In the illustration of FIG. 4, the elements of the invention which are different from, but analogous to, elements in the preferred embodiment 10, are denumerated with an initial numeral "4" with the analogous reference, while unchanged elements retain original designations. Identical elements, if designated, are given the same designation numerals as in the preferred embodiment 10.

The only portion of the alternate embodiment 410 of the invention, which is different from the preferred embodiment 10, is the heatsink subassembly 412. The sink block 428 has greater lateral dimensions and the transverse channel 434 does not extend all the way to the edge. Instead, the transverse channel terminates at a pair of opposed clip apertures 456, through which the end potions 48 depend to fit over the board edge 26 in the same manner as in the preferred embodiment 10. Since there is no need for the transverse channel 434 to extend beyond the edges of the component subassembly 16, the dissipation aspects of the system may be enhanced by providing fin segments 458 which extend from the outside edges of the clip apertures 456 to the edge of the sink block 428.

Figure 5:
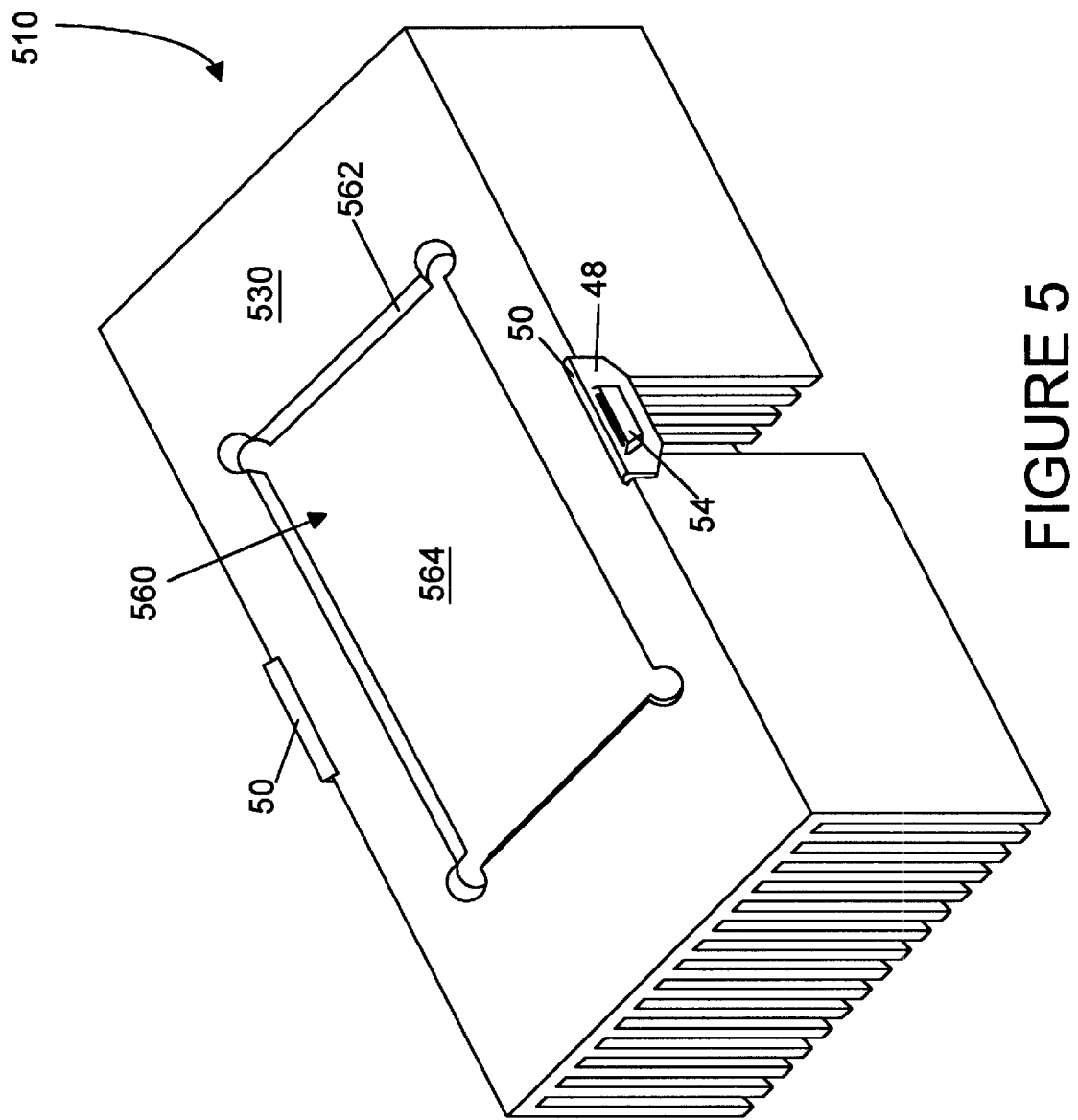
FIG. 5 is a bottom perspective view of a second alternate embodiment of the invention, incorporating a receiving recess on the contact surface.

A second alternative embodiment of the invention is illustrated in a bottom perspective view in FIG. 5 and designated by the reference character 510. The same enumerative convention is used with respect to FIG. 5 and with FIG. 4, above. The second alternate embodiment 510 is substantially similar to either of the other embodiments, but is further provided with structure to facilitate the interface with the chip portion 18 and particularly with those structures involving significant globs 19.

In the second alternate embodiment 510, the modified contact surface 520 is provided with a centrally disposed receiving recess 560 which is adapted to be roughly the same dimensions as the glob 19, such that it will permit good spatial mating therewith. The receiving recess 560 includes a set of surrounding recess walls 562 and a recess ceiling 564. In addition to improving the thermal conductive abutment of the heatsink block 28 with the chip portion 18, the receiving recess 560 also serves to facilitate installation alignment, inhibit lateral shift and minimize the resulting peripheral gap 39. This also serves to minimize the total "height" of the system 510 with respect to the PCB 21, aiding in installation and containment logistics.

The manner of use of the invention may be discerned from the following description of a typical situation. A component subassembly 16 will have been installed on a PCB 21 by soldering or other securing method. The heatsink block 28 will then be placed on top of the component subassembly 16 with the thermal contact surface 24 of the chip portion 18 being in flat abutment against the contact surface 30 of the heatsink block 28, or the receiving recess ceiling 564 of the second alternate embodiment 510. The spring clip 40 will then be placed in the transverse channel 34, with the adjusting screw 42 being turned enough to only partially extend downward through the threaded aperture 44. Since there is minimal tension at this stage, the lips 50 may then be placed (using the pry handles 54, as necessary, to provide spreading force) over (or under, in typical orientations) opposing positions on the board edge 26 in a manner such that the lips 50 extend into the inter-board gap 23. The adjusting screw 42 extends downward and engages the centering detent 38, which has a diameter small enough to prevent lateral slippage of the adjusting screw 42, but large enough to avoid interference with the rotation. Continued tightening rotation of the adjusting screw 42 forces the center of the pretensioned arc 46 upward away from the channel floor 36. This translates directly to approximately equal upward force on each of the end portions 48 and increased pressure on the interface between the chip portion 18 and the heat sink block 28. The adjusting screw 42 will be tightened until an empirically determined optimal pressure level is achieved, and the installation will be complete (the invention 10 maintaining the desired pressure level until removed or readjusted).

Removal of the heatsink subassembly is accomplished in the reverse order, with use of the pry handle portions 54 expected to be frequently necessary in order to overcome binding between the lips 50 and the circuit board 20.

Of course, in many instances, the heatsink subassembly 14 will be installed on the component subassembly 16 prior to mounting on the PCB 21. In such an instance, the component subassembly may be laterally slid into position intermediate the lips 50 and the contact surface 30, prior to tightening. Since the thickness of the lips 50 is minimal, these portions depend below the circuit board 20 to a minimal degree, and do not materially interfere with subsequent mounting of the combined assembly onto the PCB 21. Similarly, subsequent to installation by either method, the lips 50 will avoid providing a thermal or electrical conductive path between the various elements, with the optional nonconductive coating 52 further minimizing the potential of such.

Thermal and electrical conductivity are frequently related in materials, so the preferred materials for the heatsink subassembly 12 will typically be good electrical conductors as well as heat conductors. In addition to breakage considerations, and loss of contact between the surface-mount contact 22 and the PCB 21, the electrical conductivity of the heatsink block 28 provides an incentive to maintain the peripheral gap 39 at a level which prevents any electrical shorts to the heatsink subassembly 12.

On the other hand, it is not desirable that the mounting subassembly 14 be a good conductor of either heat or electricity. However, resiliency and mechanical considerations overcome the other aspects and spring steel is ordinarily the preferred material, although the nonconductive coating 52 helps to prevent any unwanted conductance in the inter-board gap 23 where space considerations are the tightest. In general, the likelihood of undesired contact is very low, so this is not a necessity.

In addition to the above mentioned examples, various other modifications and alterations of the structure may be made without departing from the invention. Accordingly, the above disclosure is not to be considered as limiting and the appended claims are to be interpreted as encompassing the entire spirit and scope of the invention.

INDUSTRIAL APPLICABILITY

A great need exists in the industry for repeatable methods of obtaining maximal heat dissipation performance from semiconductor heatsink assemblies. This is especially true in surface-mount applications where space is at a premium and attachment without interfering with the contact is required. The present invention provides heatsink and mounting structures which achieve the desired goals with minimum side effects.

An embodiment of the invention has been subjected to actual testing by a third party in accordance with Military Standard 883. This testing involved mechanical shock, vibration frequency, temperature cycling during shock testing and independent temperature cycling (3000 cycles) between 0° and 100° C. The Clincher™ series of heatsink assemblies of Intricast, Inc., embodying the present invention, has been found to pass this testing and has been recommended for end users of the Ball Grid Array (BGA) packages of at least one manufacturer.

The removable heatsink assembly of the present invention has been found to eliminate the need for choosing between high thermal performance and ease of rework of BGA packages, while retaining adjustability. As a result, the assembly system is, at the time of preparation of this document, being considered for the SMT Vision award by the SMT Design Engineers organization.

For the above, and other, reasons, it is expected that the adjustable-pressure mount heat sink system 10 of the present invention will have widespread industrial applicability. Therefore, it is expected that the commercial utility of the present invention will be extensive and long lasting.

What is claimed is:

1. A heatsink apparatus for dissipating heat from an object having at least one generally planar surface, the apparatus comprising: heatsink body means including a thermal contact surface for abutting against a planar surface of the object and conductively exchanging thermal energy therewith and heat dissipation means for dissipating thermal energy to the ambient surroundings; and adjustable pressure mounting means for securing said heatsink body means to the object such that an adjustable amount of pressure may be maintained intermediate the thermal contact surface of said heatsink means and the planar surface of the object, said adjustable pressure mounting means including a spring clip to engage the object and adjusting means for modifying the tension of the spring clip.

2. The heatsink apparatus of claim 1, wherein said object includes opposing surface edges and said spring clip includes a pair of lip portions for extending over and engaging the opposing surface edges.

3. The heatsink apparatus of claim 1, wherein the spring clip includes a tensioned arc portion having a threaded aperture therein; and the adjusting means includes a threaded adjusting screw to mate with the threaded aperture.

4. The heatsink apparatus of claim 1, wherein the spring clip includes a pair of opposing end portions for engaging said object, at least one of the end portions including a pry handle which may be engaged to pry the end portion outward to facilitate engagement to and disengagement of the end portion from the object.

5. The heatsink apparatus of claim 1, wherein the spring clip includes a pair of opposing end portions for engaging said object, the end portions having an electrically nonconductive coating disposed thereon.

6. The heatsink apparatus of claim 1, wherein said heatsink body means includes a transverse channel having a channel floor disposed opposite the contact surface; and said adjustable pressure mounting means includes a pretensioned spring clip disposed within the transverse channel.

7. The heatsink apparatus of claim 6, wherein the pretensioned spring clip includes a threaded aperture centrally disposed therein; and an adjusting screw, threaded to mate with the threaded aperture, is provided to extend through the threaded aperture and abut against the channel floor such that rotation of the adjusting screw results in concurrent adjustment of the pressure applied by said pressure mounting means upon the object.

8. The heatsink apparatus of claim 1, wherein the planar surface of the object includes at least one pair of opposed lateral edges and wherein said heatsink body means includes a transverse channel extending a length corresponding to at least one lateral dimension of the generally planar surface of the object, a pair of opposing clip apertures being formed in the transverse channel at positions corresponding to the lateral edges; and said adjustable pressure mounting means includes a spring clip disposed substantially within the transverse channel, the spring clip including a pair of opposing end portions for depending through the clip apertures to engage the opposed lateral edges.

9. The heatsink apparatus of claim 1, wherein the object includes a protruding glob portion enclosing a heat generating element and wherein the thermal contact surface of said heatsink body includes a receiving recess, having a shape generally corresponding to the glob portion, for receiving the glob portion therein and conductively transferring heat therefrom into said heatsink body.

10. In a heat dissipation assembly for dissipating thermal energy from an electronic chip component having a board portion mounted on a printed circuit board, the board portion including opposing board edges, the improvement comprising:

a heatsink subassembly including a heatsink block having a contact surface for abutting against said electronic chip component and a transverse channel extending across the portion of the heatsink block opposing the contact surface; and a mounting subassembly disposed within the transverse channel to engage said opposing board edges, said mounting subassembly including a spring clip member including at least one threaded arc portion having opposing end portions to engage said opposing board edges and tensioning adjustment means for modifying the tension applied to said opposing board edges by the spring clip.

11. The improvement of claim 10, wherein said tensioning adjustment means is adapted to be externally adjustable in order to optimize contact pressure between said heatsink subassembly and the electronic chip component, without detrimentally stressing the board portion.

12. The improvement of claim 10, wherein the tensioning adjustment means includes a spring clip member having a pair of clip ends adapted to engage the board edges, the spring clip member having a threaded aperture centrally disposed therein, and a threaded screw adapted to mate with the treaded aperture such that the pressure applied by the spring clip upon the opposing board edges is proportional to the rotation of the threaded screw with respect to the threaded aperture.

13. The improvement of claim 10, wherein said heatsink subassembly includes a transverse channel disposed in the heatsink block opposite the contact block, and said mounting subassembly includes a pretensioned spring clip adapted to be substantially disposed within the transverse channel.

14. A heatsink apparatus for use with a surface mounted electronic chip component, the chip component including a heat producing portion disposed on the surface of a generally planar board portion having opposing edges, the apparatus comprising:

a heatsink block portion having a contact surface for thermally conductively abutting against the heat producing portion and heat dissipation means for dissipating heat away from the contact surface, said heatsink block including a transverse channel formed therein opposite the contact surface, the transverse channel having a length corresponding to the distance between the opposing edges of the board portion; and adjustable pressure means for securing said heatsink block portion to the chip component at an empirically determined optimal pressure, said adjustable pressure means being disposed substantially within the transverse channel and including end portions for extending beyond the contact surface to engage the opposing edges of the board.

15. The heatsink apparatus of claim 14, wherein said heatsink block extends laterally beyond the extent of the transverse channel and includes clip apertures extending through the contact surface thereof to facilitate engagement of the end portions with the opposing edges of the board.

16. The heatsink apparatus of claim 14, wherein said heatsink block portion includes a receiving recess formed in the contact surface to spatially receive therein the heat producing portion of the electronic component.

* * * * *